US010566765B2

(12) United States Patent
Kurczveil et al.

(10) Patent No.: US 10,566,765 B2
(45) Date of Patent: Feb. 18, 2020

(54) MULTI-WAVELENGTH SEMICONDUCTOR LASERS

(71) Applicant: HEWLETT PACKARD ENTERPRISE DEVELOPMENT LP, Houston, TX (US)

(72) Inventors: Geza Kurczveil, Palo Alto, CA (US); Di Liang, Palo Alto, CA (US); Raymond G. Beausoleil, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 530 days.

(21) Appl. No.: 15/335,909

(22) Filed: Oct. 27, 2016

(65) Prior Publication Data
US 2018/0261978 A1 Sep. 13, 2018

(51) Int. Cl.
H01S 5/00 (2006.01)
H01S 5/10 (2006.01)
(Continued)

(52) U.S. Cl.
CPC ............ H01S 5/1092 (2013.01); H01S 5/021 (2013.01); H01S 5/0601 (2013.01); H01S 5/0602 (2013.01); H01S 5/0651 (2013.01); H01S 5/0657 (2013.01); H01S 5/1003 (2013.01); H01S 5/1014 (2013.01);
(Continued)

(58) Field of Classification Search
CPC .... H01S 5/1092; H01S 5/0208; H01S 5/0601; H01S 5/0651; H01S 5/0657; H01S 5/06817; H01S 5/1014; H01S 5/1032; H01S 5/1071; H01S 5/3413; H01S 5/50;
(Continued)

(56) References Cited

U.S. PATENT DOCUMENTS 5,757,027 A 5/1998 Kuchta
6,040,590 A 3/2000 Obrien et al.
(Continued)

FOREIGN PATENT DOCUMENTS

CN 103843210 A 6/2014
KR 10-2000-0055239 A 9/2000
(Continued)

OTHER PUBLICATIONS

Liu Y. A., et al., "Quantum Dot Lasers for Silicon Photonics," (Research Paper), Oct. 2015, Photon. Res. vol. 3,.5, pp. B1-B9, available at http://optoelectronics.ece.ucsb.edu/sites/default/files/publications/Liu%20PR%202015.pdf.
(Continued)

Primary Examiner — Kinam Park
(74) Attorney, Agent, or Firm — Sheppard Mullin Richter & Hampton LLP

(57) ABSTRACT

Examples disclosed herein relate to multi-wavelength semiconductor lasers. In some examples disclosed herein, a multi-wavelength semiconductor laser may include a silicon-on-insulator (SOI) substrate and a quantum dot (QD) layer above the SOI substrate. The QD layer may include and active gain region and may have at least one angled junction at one end of the QD layer. The SOI substrate may include a waveguide in an upper silicon layer and a mode converter to facilitate optical coupling of a lasing mode to the waveguide.

17 Claims, 9 Drawing Sheets

(51) Int. Cl.
| | |
|---|---|
| *H01S 5/34* | (2006.01) |
| *H01S 5/065* | (2006.01) |
| *H01S 5/06* | (2006.01) |
| *H01S 5/22* | (2006.01) |
| *H01S 5/02* | (2006.01) |
| H01S 5/068 | (2006.01) |
| H01S 5/50 | (2006.01) |

(52) U.S. Cl.
CPC .......... *H01S 5/1032* (2013.01); *H01S 5/1067* (2013.01); *H01S 5/1071* (2013.01); *H01S 5/2224* (2013.01); *H01S 5/3412* (2013.01); H01S 5/0208 (2013.01); H01S 5/06817 (2013.01); H01S 5/50 (2013.01); H01S 2301/02 (2013.01)

(58) Field of Classification Search
CPC ...... H01S 5/021; H01S 5/2224; H01S 5/1067; H01S 5/1003
See application file for complete search history.

(56) References Cited

U.S. PATENT DOCUMENTS

| | | | |
|---|---|---|---|
| 6,085,237 A | 7/2000 | Durham et al. | |
| 6,487,354 B1* | 11/2002 | Ferm ................... | G02B 6/1221 385/129 |
| 6,704,792 B1 | 3/2004 | Oswald | |
| 6,734,105 B2 | 5/2004 | Kim | |
| 6,774,448 B1 | 8/2004 | Lindemann et al. | |
| 6,902,987 B1 | 6/2005 | Tong et al. | |
| 7,244,679 B2 | 7/2007 | Koh | |
| 7,257,283 B1 | 8/2007 | Liu et al. | |
| 7,561,605 B1 | 7/2009 | Delfyett et al. | |
| 7,565,084 B1* | 7/2009 | Wach .................. | H04B 10/506 398/183 |
| 7,627,018 B1 | 12/2009 | Guilfoyle et al. | |
| 7,653,106 B2 | 1/2010 | Arimoto | |
| 7,873,992 B1 | 1/2011 | Daily et al. | |
| 7,935,956 B2 | 5/2011 | Xie | |
| 8,110,823 B2 | 2/2012 | Bowers | |
| 9,065,572 B1 | 6/2015 | Wach | |
| 9,110,219 B1 | 8/2015 | Zhang et al. | |
| 9,166,363 B2* | 10/2015 | Jain ........................ | B82Y 20/00 |
| 9,343,874 B2 | 5/2016 | Liu et al. | |
| 9,450,379 B2 | 9/2016 | Zhang et al. | |
| 9,494,734 B1* | 11/2016 | Jain ..................... | G02F 1/01708 |
| 2003/0081642 A1 | 5/2003 | Hwang et al. | |
| 2003/0086635 A1 | 5/2003 | Bylsma et al. | |
| 2004/0037342 A1 | 2/2004 | Blauvelt et al. | |
| 2004/0114641 A1 | 6/2004 | Wise et al. | |
| 2004/0247005 A1 | 12/2004 | Schrodinger et al. | |
| 2006/0039424 A1 | 2/2006 | Thoma et al. | |
| 2007/0133632 A1 | 6/2007 | Doerr | |
| 2007/0170417 A1 | 7/2007 | Bowers | |
| 2008/0002929 A1 | 1/2008 | Bowers et al. | |
| 2008/0049802 A1 | 2/2008 | Kim et al. | |
| 2009/0154517 A1 | 6/2009 | Leem et al. | |
| 2009/0245298 A1 | 10/2009 | Sysak et al. | |
| 2009/0245316 A1 | 10/2009 | Sysak et al. | |
| 2009/0274411 A1 | 11/2009 | Bar et al. | |
| 2010/0111128 A1 | 5/2010 | Qin et al. | |
| 2010/0142973 A1 | 6/2010 | Gubenko et al. | |
| 2011/0080090 A1 | 4/2011 | Wood et al. | |
| 2011/0134939 A1 | 6/2011 | Zhang | |
| 2011/0163421 A1* | 7/2011 | Mi ........................ | B82Y 10/00 257/618 |
| 2011/0299561 A1 | 12/2011 | Akiyama | |
| 2012/0008658 A1 | 1/2012 | Chung | |
| 2012/0063484 A1 | 3/2012 | Goddard et al. | |
| 2012/0093456 A1* | 4/2012 | Taillaert ............... | G02B 6/1228 385/14 |
| 2012/0189317 A1 | 7/2012 | Heck et al. | |
| 2012/0205352 A1* | 8/2012 | Fermann .............. | H01S 3/1608 219/121.67 |
| 2012/0300796 A1 | 11/2012 | Sysak et al. | |
| 2012/0320939 A1 | 12/2012 | Baets et al. | |
| 2013/0107901 A1* | 5/2013 | Deppe ................... | B82Y 20/00 372/36 |
| 2013/0143336 A1 | 6/2013 | Jain | |
| 2013/0182730 A1 | 7/2013 | Fan et al. | |
| 2014/0264031 A1 | 9/2014 | Fermann et al. | |
| 2014/0363127 A1* | 12/2014 | Baets ..................... | G02B 6/124 385/37 |
| 2015/0111325 A1 | 4/2015 | Hsu et al. | |
| 2015/0139264 A1* | 5/2015 | Zhang .................... | H01S 5/141 372/107 |
| 2015/0177458 A1 | 6/2015 | Bowers et al. | |
| 2015/0333480 A1 | 11/2015 | Santis et al. | |
| 2016/0276807 A1 | 9/2016 | Cai et al. | |
| 2016/0356960 A1* | 12/2016 | Novack .............. | G02B 6/29332 |
| 2017/0187161 A1 | 6/2017 | Fermann et al. | |
| 2017/0207600 A1* | 7/2017 | Klamkin ............. | H01S 5/02292 |
| 2018/0026830 A1 | 1/2018 | Bhatia et al. | |
| 2018/0191134 A1 | 7/2018 | Osinski et al. | |

FOREIGN PATENT DOCUMENTS

| | | |
|---|---|---|
| KR | 20150097306 A | 8/2015 |
| WO | WO-2016011002 A1 | 1/2016 |
| WO | 20161018285 A1 | 2/2016 |

OTHER PUBLICATIONS

Tang, M. et al., "Direct Integration of Quantum Dot Lasers on Silicon," (Research Paper), 18th European Conference on Integrated Optiics 2016, May 18-20, 2016, 2 pages, available at http://www.ecio-conference.org/wp-content/uploads/2016/06/ECIO-I-04.pdf.

Wang T., "High-Performance III-V Quantum-Dot Lasers Monolithically Grown on Si and Ge Substrates for Si Photonics," (Research Paper), University College of London, 2012, 1 pages, available at http://ethos.bl.uk/OrderDetails.do?uin=uk.bl.ethos.568246.

Zhu et al., Ultrabroadband flat dispersion tailoring of dual-slot silicon waveguides, Optics Express, vol. 20, Issue 14, 2012, pp. 15899-15907.

Zhang et al., "Silicon waveguide with four zero-dispersion wavelengths and its application in on-chip octave-spanning supercontinuum generation", Optics Express, vol. 20, Issue 2, 2012, pp. 1685-1690.

Waylin J. Wing et al., "Improvement of Plasmonic Enhancement of Quantum Dot Emission via an Intermediate Silicon-aluminum Oxide Interface," Applied Physics Letters 106, 2015, pp. 013105-1-013105-4, AIP Publishing LLC.

Tan et al., "Monolithic nonlinear pulse compressor on a silicon chip", Nature Communications, vol. 116, 2010, 6 pages.

Resan et al., "Dispersion-managed breathing-mode semiconductor mode-locked ring laser: experimental characterization and numerical simulations", IEEE Journal of Quantum Electronics, vol. 40, Issue 3, Mar. 2004, pp. 214-221.

Katsuaki Tanabe et al., "High-Temperature 1.3 InAS/GaAs Quantum Dot Lasers on Si Substrates Fabricated by Wafer Bonding," Applied Physics Express 6, Published on Jul. 25, 2013, pp. 082703-1-082703-4, The Japan Society of Applied Physics.

Chang et al., "Optimization of Filtering Schemes for Broadband Astro-combs," (Research Paper), Optics Express, vol. 20, No. 22, Oct. 22, 2012, pp. 24987-25013.

"SnmpSharpNet", SNMP Library for C#, Project Updates, available online at <http://www.snmpsharpnet.com/?page_id=160&paged=2>, retrieved on Jun. 13, 2018, 8 pages.

Moskalenko et al., "A Wide Bandwidth Coherent Optical Comb Source Based on a Monolithically Integrated Mode-Locked Ring Laser", Optical Fiber Communication Conference, Mar. 2014, 3 pages.

International Search Report and Written Opinion received for PCT Patent Application No. PCT/US18/53664, dated Feb. 28, 2019, 12 pages.

(56) References Cited

OTHER PUBLICATIONS

Delfyett et al., "Chirped pulse laser sources and applications", Progress in Quantum Electronics, vol. 36, Nov. 3, 2012, pp. 475-540.

* cited by examiner

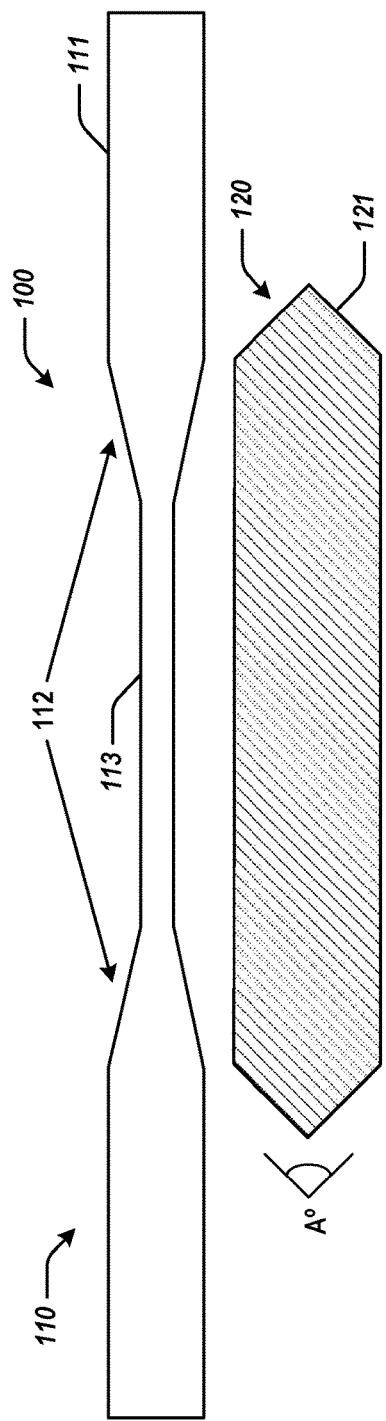
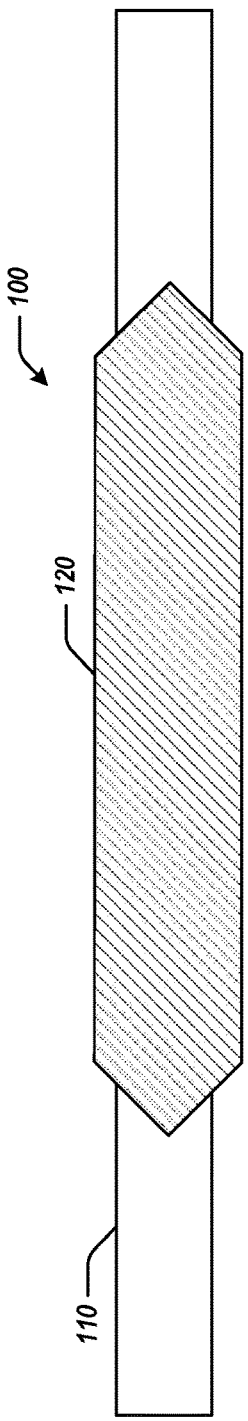
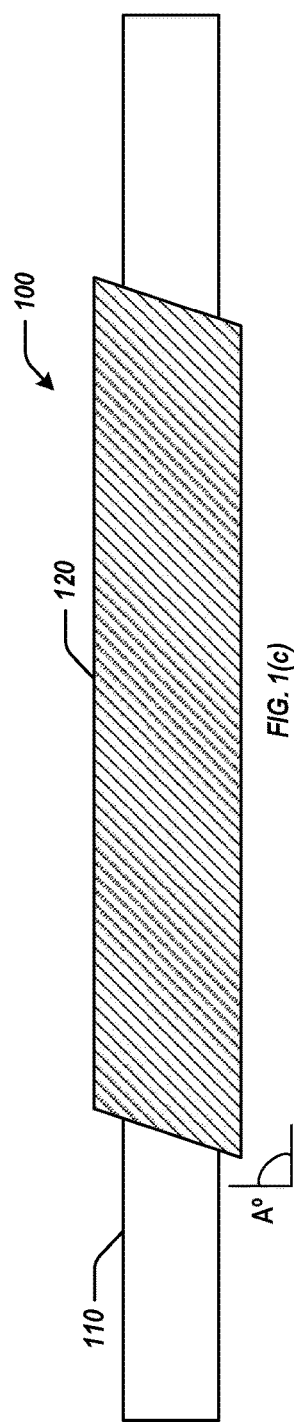
FIG. 1(a)
FIG. 1(b)
FIG. 1(c)

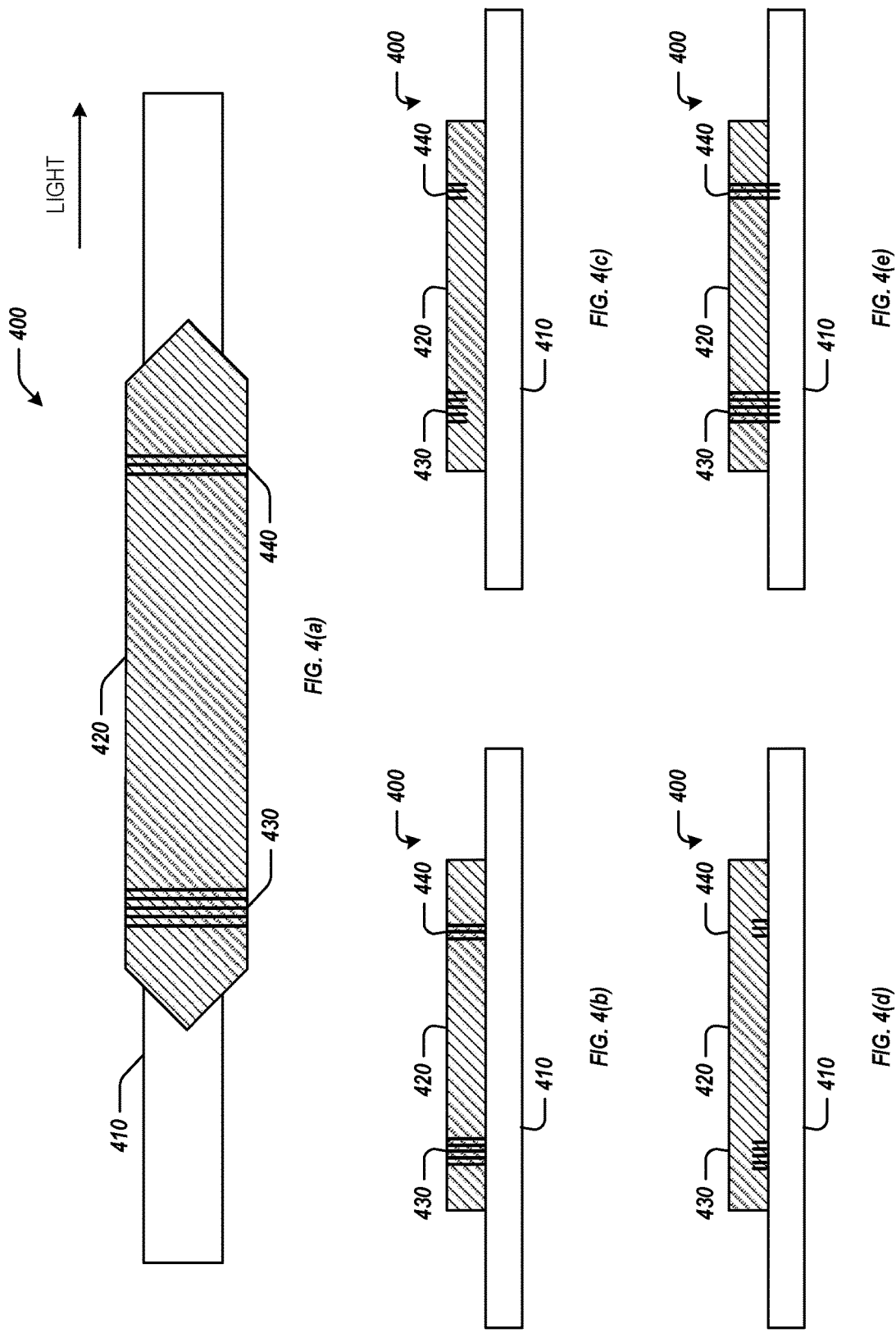

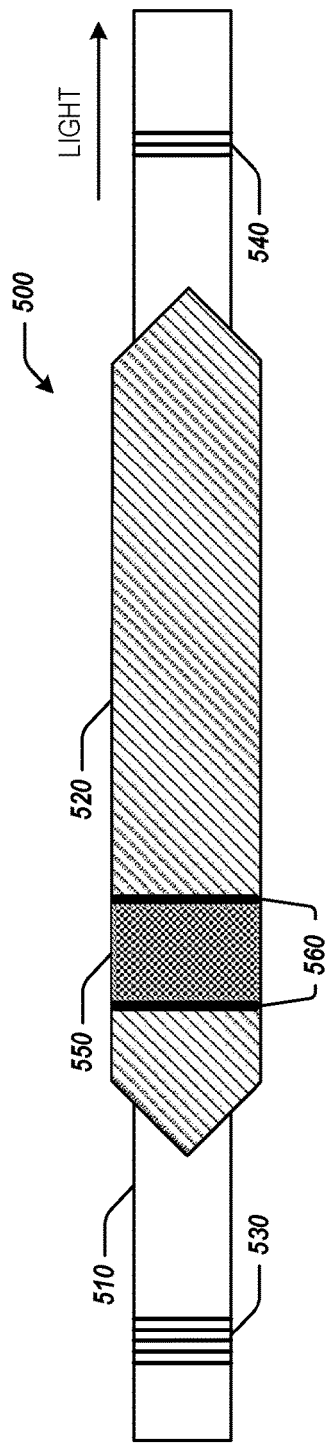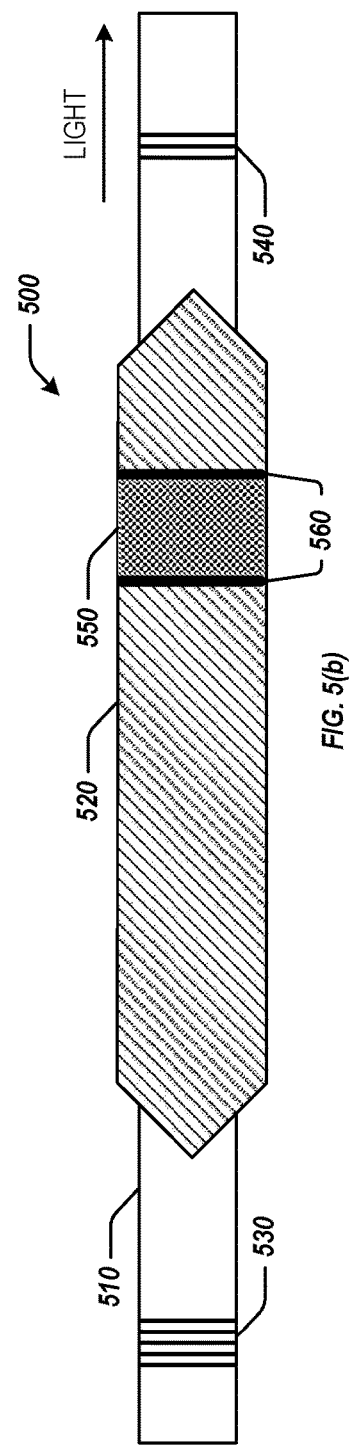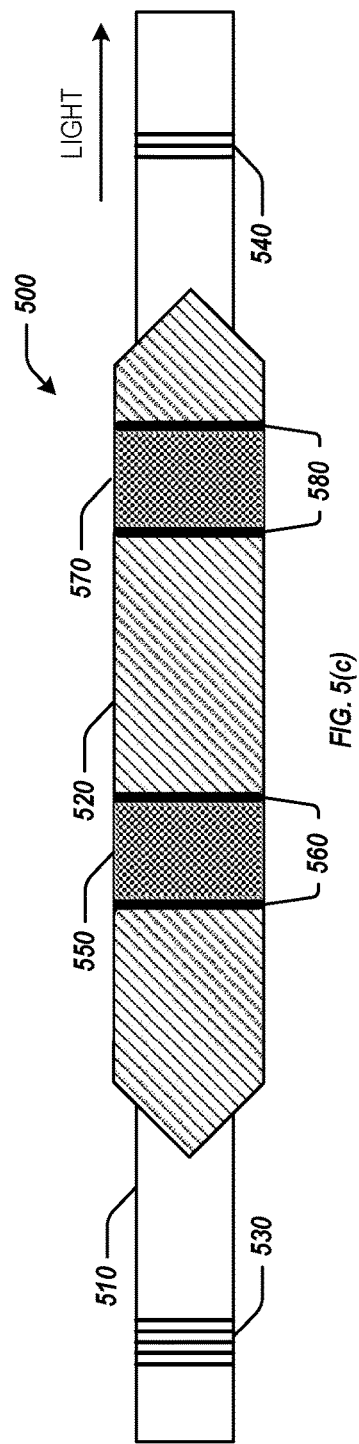

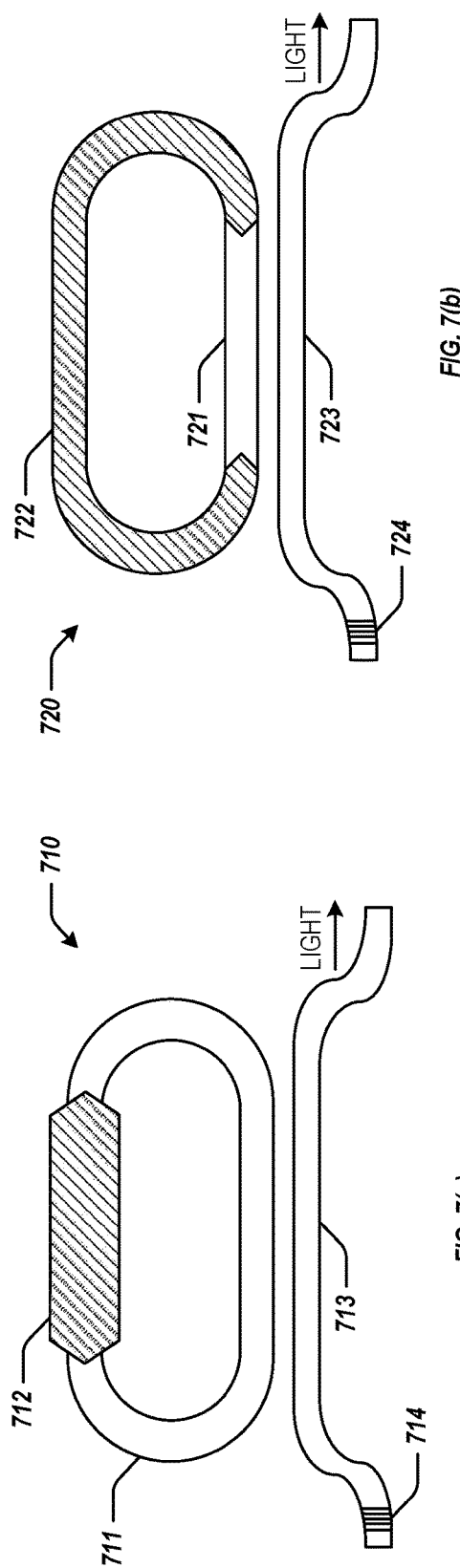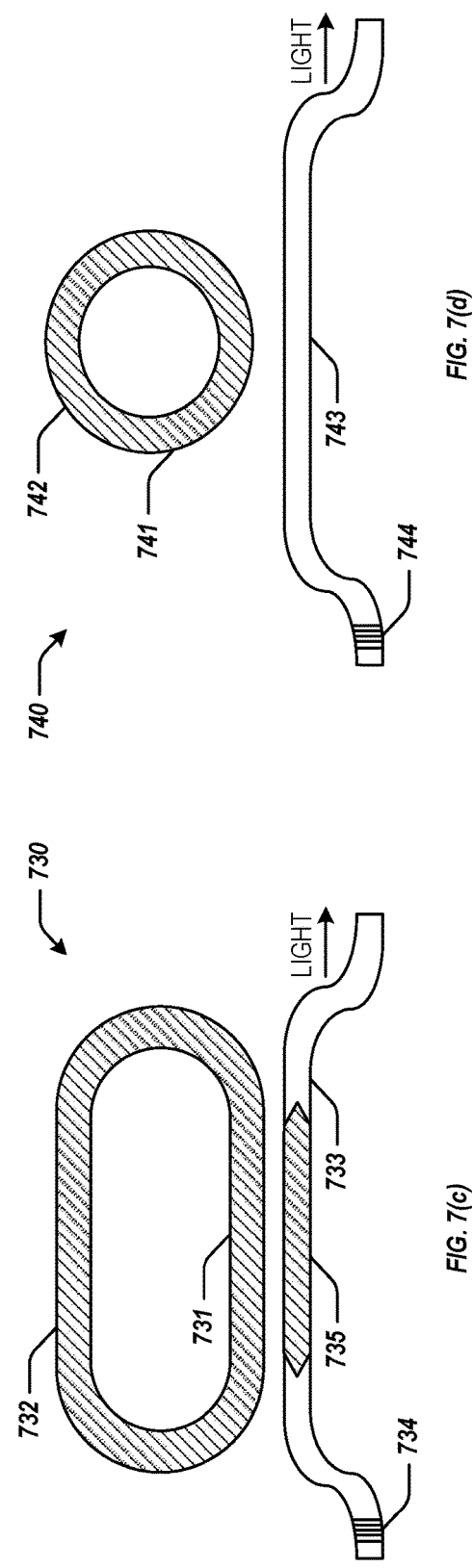

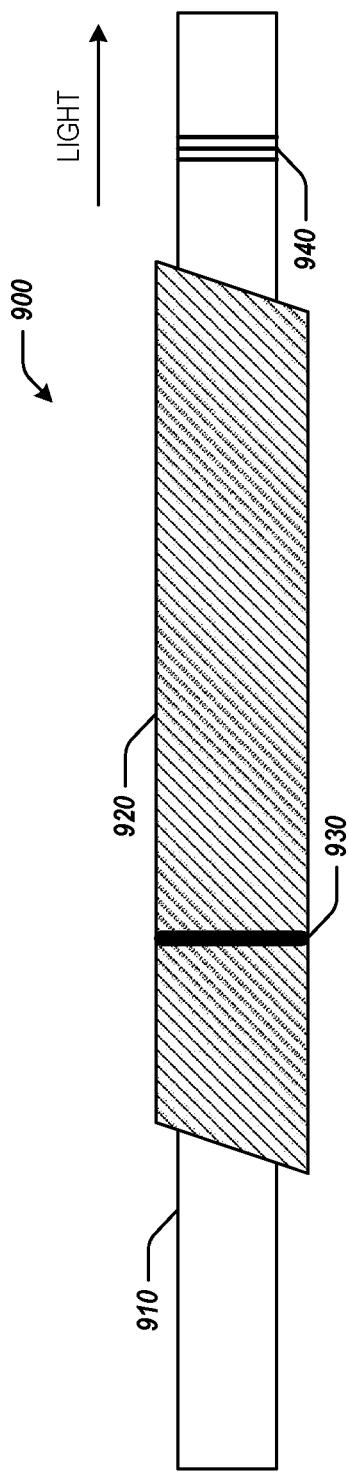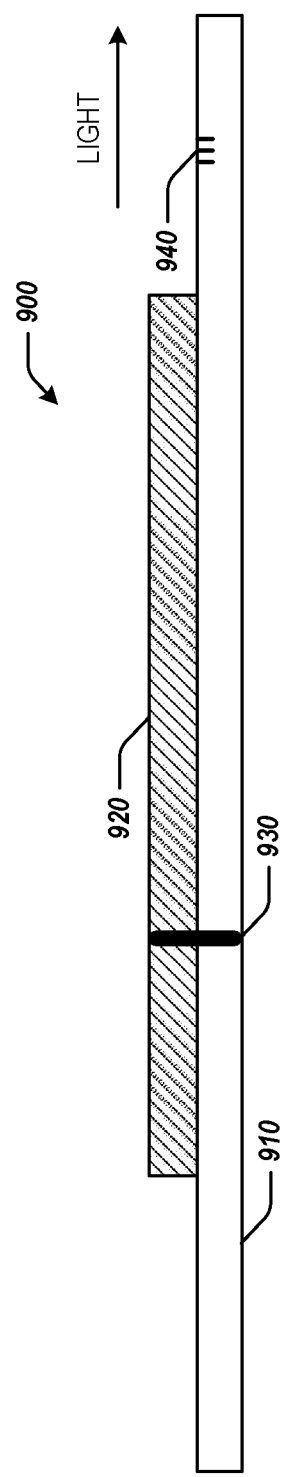
FIG. 9(a)
FIG. 9(b)

MULTI-WAVELENGTH SEMICONDUCTOR LASERS

STATEMENT OF GOVERNMENT INTEREST

This invention was made with government support under Contract No. H98230-12-C-0236, awarded by Maryland Procurement Office. The government has certain rights in the invention.

BACKGROUND

Semiconductor lasers based on quantum dot (QD) gain material are attractive candidates for multi-wavelength lasers due to their low relative intensity noise compared to quantum well-based lasers.

BRIEF DESCRIPTION OF THE DRAWINGS

The following detailed description references the drawings, wherein:

FIGS. 1(a)-1(c) are block diagrams depicting an example multi-wavelength semiconductor laser;

FIGS. 4(a)-4(e) are block diagrams depicting example multi-wavelength semiconductor lasers;

FIGS. 5(a)-5(c) are block diagrams depicting example multi-wavelength semiconductor lasers;

FIGS. 7(a)-7(d) are block diagrams depicting example multi-wavelength semiconductor lasers;

FIGS. 9(a) and 9(b) are block diagrams depicting an example multi-wavelength semiconductor laser.

DETAILED DESCRIPTION

Figure 2:
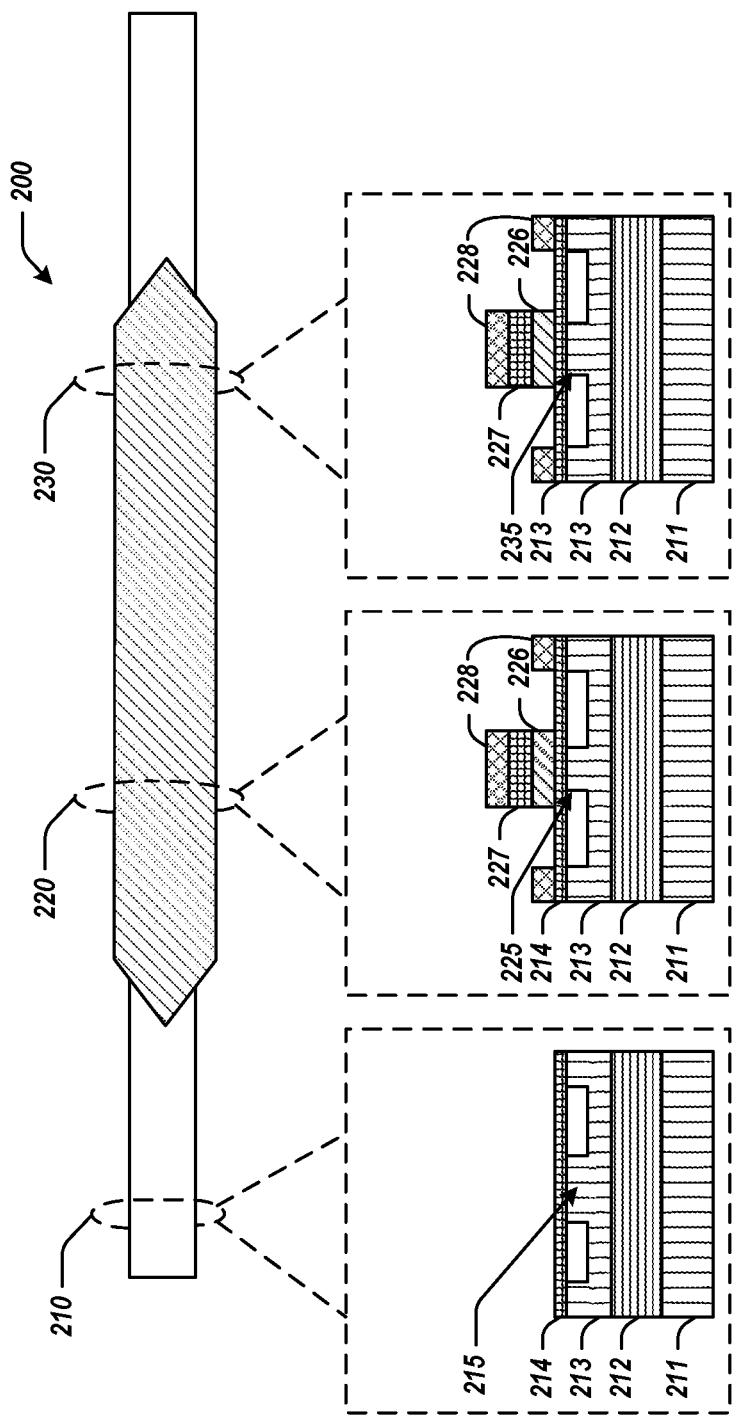
FIG. 2 is a block diagram depicting cross-sectional views of an example multi-wavelength semiconductor laser.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

Examples disclosed herein provide multi-wavelength semiconductor lasers fabricated using silicon-on-insulator (SOI) substrates. The example multi-wavelength semiconductor lasers disclosed herein provide high performance and low amplitude noise while being capable of being integrated in high volumes at low cost. Moreover, the example multi-wavelength semiconductor lasers disclosed herein are capable of being integrated with high-quality passive silicon components, such as grating couplers, power splitters, multiplexers/de-multiplexers, SiGe and InGaAs photodetectors, etc., on a single chip in high volume at low cost.

In accordance with some of the examples disclosed herein, a multi-wavelength semiconductor laser may include a silicon-on-insulator (SOI) substrate and a quantum dot (QD) layer above the SOI substrate. The QD layer may include an active gain region and may have at least one angled junction at one end of the ends of the QD layer. The SOI substrate may include a waveguide in an upper silicon layer and a mode converter to facilitate optical coupling of a lasing mode to the waveguide.

FIGS. 1(a)-1(c) are block diagrams depicting top-down views of an example multi-wavelength semiconductor laser 100. In some implementations, laser 100 may be a comb laser. That is, laser 100 may be a laser that produces a spectrum of light having a series of discrete, equally-spaced frequency elements. As shown in FIGS. 1(a)-1(c), laser 100 may include various components, such as a waveguide 110 included in an upper silicon layer of a silicon-on-insulator (SOI) substrate, and a quantum dot (QD) layer 120 that includes an active gain region. The number and arrangement of these components is an example only and provided for purposes of illustration. Other arrangements and numbers of components may be utilized without departing from the examples of the present disclosure.

FIG. 1(a) depicts laser 100 in an exploded view, showing the detail of waveguide 110 and QD layer 120, whereas FIGS. 1(b) and 1(c) depict laser 100 in assembled views.

QD layer 120 may be a mesa structure formed using various III-V semiconductor materials, such as InAs, InGaAs, GaAs, InP, InGaP, InGaAsP, etc. The QD material may comprise quantum dots, or nanoscale semiconductor particles, that are capable of generating a plurality of optical wavelengths. The active region included in QD layer 120 may be defined as the region of laser 100 that generates light. The active region area may comprise, for example, the area between the optical feedback mirrors of laser 100 (not shown). Thus, in implementations where the mirrors are etched in waveguide 110 outside of QD layer 120, the active region may include the entire QD layer 120, and in implementations where the mirrors are etched in QD layer 120, the active region may include the portion of QD layer 120 between the mirrors.

QD layer 120 may include a junction 121 at each end of QD layer 120. In some implementations, at least one of junctions 121 may be tapered junctions such as those shown in FIGS. 1(a) and 1(b). The taper angle A° may be, for example, between 1°-45°. In some implementations, at least one of junctions 121 may be angled junctions such as those shown in FIG. 1(c). The angle A° may, for example, be between 1°-45°.

Waveguide 110 may be used to guide the propagation of light generated in the active region of QD layer 120. As shown in FIG. 1(a), waveguide 110 may be made up of various widths, such as width 111 and width 113, along the length of waveguide 110. In some implementations, width 111 may be greater than width 113 while in other implementations width 111 may be less than width 113. The tapers between width 111 and width 113 may be implemented by a mode converter 112. The area of waveguide 110 between mode converter 112 at width 113 may define the laser cavity of laser 100.

As shown in FIGS. 1(b) and 1(c), QD layer 120, including the active gain region, may be above (e.g., either directly on top of or on top other intervening layers) waveguide 110 and the taper of mode converter 112 may be under QD layer 120 when laser 100 is assembled.

In order for laser 100 to produce a laser output, light generated in the active region of QD layer 120 may be coupled to waveguide 110 in the upper silicon layer of the SOI substrate. Mode converter 112 included in waveguide 110 may facilitate optical coupling of lasing modes (i.e., the light generated in the active region) to waveguide 110. The optical coupling may be achieved as a result of taper of mode converter 112. That is, the taper of mode converter 112 may pull the optical/lasing mode down into the silicon of waveguide 110.

Mode converter 112 may be designed such that it meets certain performance characteristics. For example, mode converter 112 may be designed to be adiabatic. As another example, mode converter 112 may be designed such that it couples a single optical mode with very low loss and low back reflection. Mode converters 112 that are designed to be too short may suffer from high passive losses whereas mode converters 112 that are designed to be too long may result in non-uniform electrical pumping, which may lead to absorption in the gain region. In some examples, the length of the taper of mode converter 112 may be between about 50 µm to about 200 µm.

FIG. 2 is a block diagram depicting cross-sectional views 210, 220, and 230 of an example multi-wavelength semiconductor laser 200. In some implementations, laser 200 may be similar to, or implemented by, laser 100 depicted in FIGS. 1(a)-1(c). The number and arrangement of these components is an example only and provided for purposes of illustration. Other arrangements and numbers of components may be utilized without departing from the examples of the present disclosure.

Cross-sectional view 210 may be a cross-sectional view of laser 200 at a location near a first end of laser 200's waveguide (e.g., waveguide 110 of FIGS. 1(a)-1(c)) where no part of the QD layer is above the waveguide. In cross-sectional view 210, layers 211, 212, and 213 may make up a SOI substrate, wherein layer 211 is a bottom silicon layer, layer 212 is a buried oxide (BOX) layer (e.g., $SiO_2$), and layer 213 is an upper silicon layer. The waveguide of laser 200 may be formed in upper silicon layer 213 of the SOI substrate. The waveguide may have a width 215 at the point along the waveguide where cross-sectional view 210 is located. A cladding layer 214 may be deposited on top of upper silicon layer 213. In some implementations, cladding layer 214 may comprise AlGaAs. In some implementations, cladding layer 214 may comprise GaAs.

Cross-sectional view 220 may be a cross-sectional view of laser 200 at a location near the center of laser 200's waveguide and QD layer 226 (e.g., QD layer 120 of FIGS. 1(a)-1(c)). At the location of cross-sectional view 220, the waveguide of laser 200 may be at its smallest width 225 while the width of QD layer 226 may be at its widest. Moreover, at the location of cross-sectional view 220, laser 200 may include a second cladding layer 227 and metal layers 228. Cladding layer 227 may comprise materials similar to those described above with respect to cladding layer 214. Metal layers 228 may comprise any electrically conducting metal and may serve as electrodes for laser 200. The electrodes may be used to electrically inject electrical carriers that can be combined to generate light in QD layer 226.

Cross-sectional view 230 may be a cross-sectional view of laser 200 at the location of laser 200's mode converter (e.g., mode converter 112 of FIG. 1(a)), that is, at the location where laser 200's waveguide tapers between a first width and a second width. The layers at the location of cross-sectional view 230 may be similar to those at the location of cross-sectional view 220, except that laser 200's waveguide is at a width 235.

The width of the waveguide included in laser 200 may range from about 300 nm to about 2 µm and the height of the waveguide may range from about 200 nm to about 500 nm. The width of QD layer 226, except in the tapered/angled junction regions, may range from about 1 µm to about 10 µm and the height of QD layer 226 may range from about 100 nm to about 500 nm.

Figure 3A:
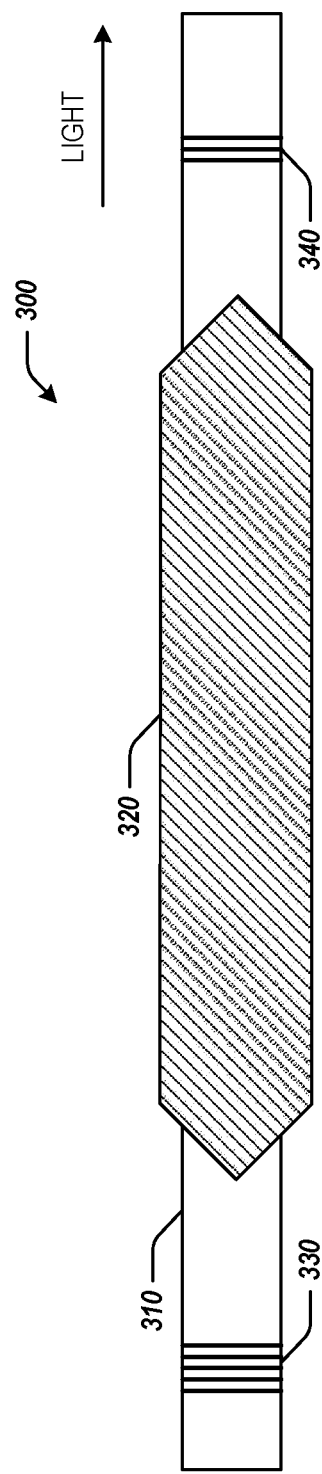
FIGS. 3(a) and 3(b) are block diagrams depicting an example multi-wavelength semiconductor laser.
Figure 3B:
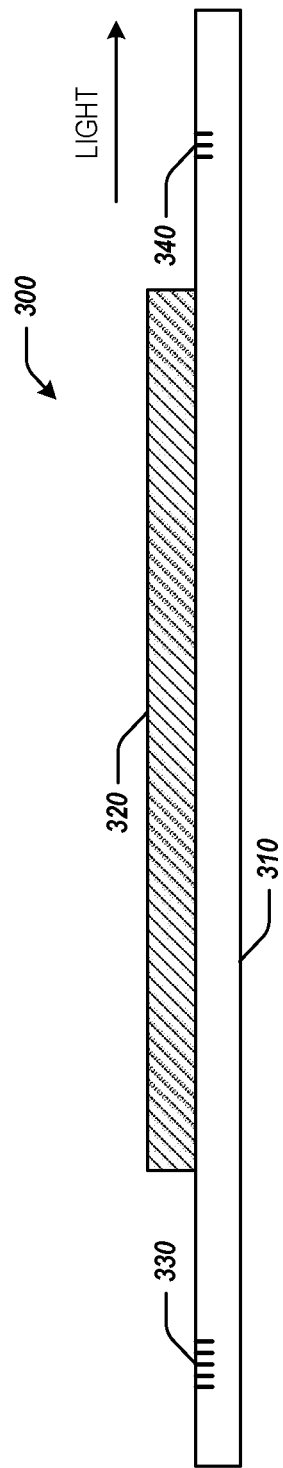

FIGS. 3(a) and 3(b) are block diagrams depicting a top-down view and a side view, respectively, of an example multi-wavelength semiconductor laser 300. As show in FIGS. 3(a) and 3(b), laser 300 may include a waveguide 310 and a QD layer 320. In some implementations, laser 300 may be similar to, or implemented by, laser 100 of FIGS. 1(a)-1(c) and/or laser 200 of FIG. 2, with the addition of mirrors 330 and 340. The number and arrangement of these components is an example only and provided for purposes of illustration. Other arrangements and numbers of components may be utilized without departing from the examples of the present disclosure.

Mirrors 330 and 340 may be used for optical feedback to reflect light in waveguide 310. In the example illustrated in FIGS. 3(a) and 3(b), mirrors 330 and 340 may be etched into waveguide 310, one at each end of waveguide 310. The space in waveguide 310 between mirrors 330 and 340 may be referred to as the laser cavity of laser 300. Mirrors 330 and 340 may be implemented as distributed Bragg reflectors, loop mirrors, reflective multimode interference (MMI) couplers, sidewall gratings, or a combination thereof. Mirrors 330 and 340 may be designed such that they have low loss, broad reflection bandwidth, and cause a minimal amount of dispersion or compensate for dispersion introduced by the rest of the laser cavity.

In some implementations, mirror 330 may have greater reflectivity than mirror 340 to ensure that light primarily travels in one direction (e.g., left to right as illustrated in FIGS. 3(a) and 3(b)). Example reflectivity of mirror 330 may range from about 90% reflectivity or greater while example reflectivity of mirror 340 may range from about 10%-70% reflectivity. Mirror 340 with too low of reflectivity may not provide enough optical feedback to make laser 300 lase, while too high of reflectivity may result in a low output power.

The spacing between mirrors 330 and 340 may determine the spacing between the multi-wavelengths emitted by laser 300. As the spacing between mirrors 330 and 340 decreases, the spacing between wavelengths becomes larger. Conversely, as the spacing between mirrors 330 and 340 increases, the spacing between wavelengths becomes smaller. Increasing the spacing between wavelengths (by decreasing spacing between mirrors 330 and 340) increases isolation between wavelengths (which reduces crosstalk between neighboring channels) but reduces utilization of the available optical spectrum. Moreover, if the spacing between mirrors 330 and 340 becomes too small, laser 300 may not be able to lase. Conversely, decreasing the spacing between wavelengths (by increasing spacing between mirrors 330 and 340) decreases isolation between wavelengths (which reduces the speed at with the wavelengths can be modulated) but increases utilization of the available optical spectrum.

As shown in the top-down view of FIG. 3(a), mirrors 330 and 340 may span the entire width of waveguide 310. In some implementations, mirrors 330 and 340 may be etched such that their depth spans a portion of the height of waveguide 310, as illustrated in the side view of FIG. 3(b). In some implementations, mirrors 330 and 340 may be etched such that their depth spans the entire height of waveguide 310.

FIGS. 4(a)-4(e) are block diagrams depicting examples of a multi-wavelength semiconductor laser 400. In some implementations, laser 400 may be similar to, or implemented by, laser 100 of FIGS. 1(a)-1(c) and/or laser 200 of FIG. 2, with the addition of mirrors 430 and 440. The number and arrangement of these components is an example only and provided for purposes of illustration. Other arrangements and numbers of components may be utilized without departing from the examples of the present disclosure.

Like mirrors 330 and 340 of FIG. 3, mirrors 430 and 440 may be used for optical feedback to reflect light in waveguide 410. In the example illustrated in FIGS. 4(a)-4(e), mirrors 430 and 440 may be etched into QD layer 420. Mirrors 430 and 440 may be implemented as distributed Bragg reflectors, loop mirrors, reflective multimode interference (MMI) couplers, sidewall gratings, or a combination thereof.

Mirrors 430 and 440 may be designed such that they have low loss, broad reflection bandwidth, and cause a minimal amount of dispersion or compensate for dispersion introduced by the rest of the laser cavity. In some implementations, mirror 430 may be placed near a first end of QD layer 420 and mirror 440 may be placed near a second end of QD layer 420. In some implementations, mirrors 430 and 440 may be positioned in QD layer 420 such that the mode converter of laser 400 is not included in the active region (and thus not included in the laser cavity). As stated above, one of the design considerations of mode converters, such as mode converter 112 of FIG. 1, is the amount of back reflection generated by the mode converters. Placing mirrors 430 and 440 in QD layer 120 such that the mode converter of laser 400 is not included in the active region (and thus not included in the laser cavity) reduces the impact of the back reflections generated by the mode converter.

In the side view of laser 400 shown in FIG. 4(b), mirrors 430 and 440 may be etched such that their depth spans the entire height of QD layer 400. In the side view of laser 400 shown in FIG. 4(c), mirrors 430 and 440 may be etched such that their depth spans a top portion of the height of QD layer 400. In the side view of laser 400 shown in FIG. 4(d), mirrors 430 and 440 may be etched such that their depth spans a bottom portion of the height of QD layer 400. In the side view of laser 400 shown in FIG. 4(e), mirrors 430 and 440 may be etched such that their depth spans the entire height of QD layer 400 and also extends into a portion of waveguide 410. The etching of mirrors 430 and 440 shown in FIG. 4(d) may be performed before QD layer 420 is bonded to the SOI substrate that includes waveguide 410, but requires careful alignment of QD layer 120 to waveguide 110. The etching of mirrors 430 and 440 shown in FIGS. 4(a), 4(b), and 4(e) may be performed before or after bonding.

FIGS. 5(a)-5(c) are block diagrams depicting top-down views of example implementations of a multi-wavelength semiconductor laser 500. In some implementations, laser 500 may be similar to, or implemented by, laser 100 of FIGS. 1(a)-1(c), laser 200 of FIG. 2, and/or laser 300 of FIGS. 3(a) and 3(b). As shown in FIGS. 5(a)-5(c), laser 500 may include a waveguide 510, a QD layer 520, and mirrors 530 and 540. Laser 500 may also include a saturable absorber (SA) 550. The number and arrangement of these components is an example only and provided for purposes of illustration. Other arrangements and numbers of components may be utilized without departing from the examples of the present disclosure. For example, in some implementations, such as the example implementation illustrated in FIG. 5(c), laser 500 may include a plurality of SAs (e.g., SA 550 and SA 570).

SA 550 and SA 570 may be a reverse-biased or unbiased portion of gain material of the active gain region included in QD layer 520. SA 550 and SA 570 may be electrically isolated from the remainder of QD layer 520 by electrical isolation 560 and electrical isolation 580, respectively, such that SA 550, SA 570, and QD layer 520 may be independently biased. Electrical isolation 560 and 580 may be implemented by etching and/or implantation of a portion of the upper cladding (e.g., cladding layer 227 of FIG. 2) 520 surrounding SA 550 and 570.

SA 550 (and SA 570 in implantations that include a second SA) may be used to reduce amplitude noise of laser 500 and to manipulate the temporal behavior of laser 500. For example, the bias voltage of SA 550 may be manipulated to change the recovery time of SA 550. Changes in recovery time of SA 550 may, in turn, be used to adjust the phase relationships between the multiple wavelengths of light oscillating in the laser cavity of laser 500. Accordingly, the phase relationships the multiple wavelengths of light oscillating in the laser cavity of laser 500 may be adjusted such that laser 500 may temporarily operate in a mode-locked regime based on the applied bias voltage.

In some implementations, the length of SA 550 and SA 570 may range from ⅓ to 1/20 the length of the laser cavity of laser 500, with example laser cavity lengths ranging from 500 μm to 2 mm. The length of electrical isolation 560 and 580 may be, for example around 10 μm. The longer the length of the SA, the greater the amplitude noise reduction will be. However, optical loss increases along with the length of SA, and too high of optical loss can result in laser 500 being unable to lase.

Figure 6:
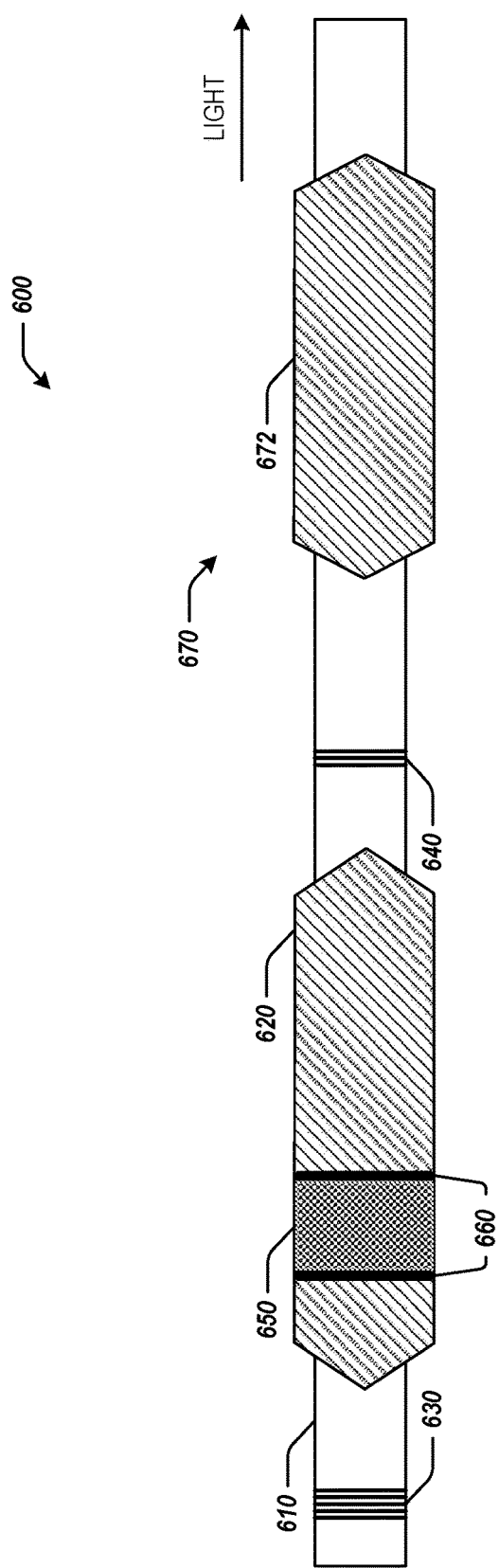
FIG. 6 is a block diagram depicting an example multi-wavelength semiconductor laser.

FIG. 6 is a block diagram depicting a top-down view of an example multi-wavelength semiconductor laser 600. In some implementations, laser 600 may be similar to, or implemented by, laser 500 of FIGS. 5(a)-5(c). As shown in FIG. 6, laser 600 may include a waveguide 610, a QD layer 620, mirrors 630 and 640, and a SA 650 in QD layer 620 between electrical isolation 660. Layer 600 may also include a booster semiconductor optical amplifier (SOA) 670, comprising a waveguide under a QD layer 672, which may be driven into saturation to further reduce amplitude noise of the individual comb lines of laser 600. The number and arrangement of these components is an example only and provided for purposes of illustration. Booster SOA 670 may be integrated with any of the other example laser implementations described herein, and other arrangements and numbers of components may be utilized without departing from the examples of the present disclosure.

FIGS. 7(a)-7(d) are block diagrams depicting top-down views of example multi-wavelength semiconductor lasers 710, 720, 730, and 740, respectively. In some implementations, lasers 710, 720, 730, and 740 may be comb lasers. The number and arrangement of these components is an example only and provided for purposes of illustration. Other arrangements and numbers of components may be utilized without departing from the examples of the present disclosure.

As shown in FIG. 7(a), laser 710 may include a waveguide ring 711 included in an upper silicon layer of a silicon-on-insulator (SOI) substrate and a quantum dot (QD) layer 712 that includes an active gain region. QD layer 712 may be positioned above a portion of waveguide ring 711 and may generate light from injected charger carriers. Waveguide ring 711 may be oval-shaped or racetrack-shaped and may be a traveling wave cavity for light generated by QD layer 712. The circumference of waveguide ring 711 may determine the multi-wavelength spacing of light generated by laser 710. That is, the greater the circumference of waveguide ring 711, the smaller the spacing between wavelengths, and vice versa.

In order to get light out of waveguide ring 711, a second waveguide 713 may be included in the upper silicon layer of the SOI substrate and may be positioned next to waveguide ring 711. Waveguide 713 may include a mirror 714 to ensure that light travels primarily in one direction (e.g., left to right) in waveguide 713. As light travels around waveguide ring 711, a portion of the traveling light may leak out into waveguide 713, the amount of which depending on the proximity of waveguide 713 to waveguide ring 711. The closer waveguide 713 is positioned to waveguide ring 711, the easier it may be for light to leak from waveguide ring 711 to waveguide 713.

Laser 720 depicted in FIG. 7(b) may include a waveguide ring 721, a QD layer 722, a waveguide 723, and a mirror 724. Laser 720 may be similar to laser 710, except that QD layer 722 of laser 720 may be larger than QD layer 712 of laser 710, and may therefore cover more of waveguide ring 721. Thus, laser 720 may have a larger active gain region than laser 710.

Laser 730 depicted in FIG. 7(c) may include a waveguide ring 731, a QD layer 732, a waveguide 733, and a mirror 734. Laser 730 may be similar to laser 710 and 720, except that QD layer 732 of laser 730 covers the entire waveguide 731. Laser 730 may additionally include a second III-V semiconductor region 735 for coupling light between waveguide ring 731 and waveguide 733.

Laser 740 depicted in FIG. 7(d) may include a waveguide ring 741, a QD layer 742, a waveguide 743, and a mirror 744. Laser 740 may be similar to laser 730, except that laser 740 may be circular-shaped and does not include a second III-V semiconductor region.

Figure 8:
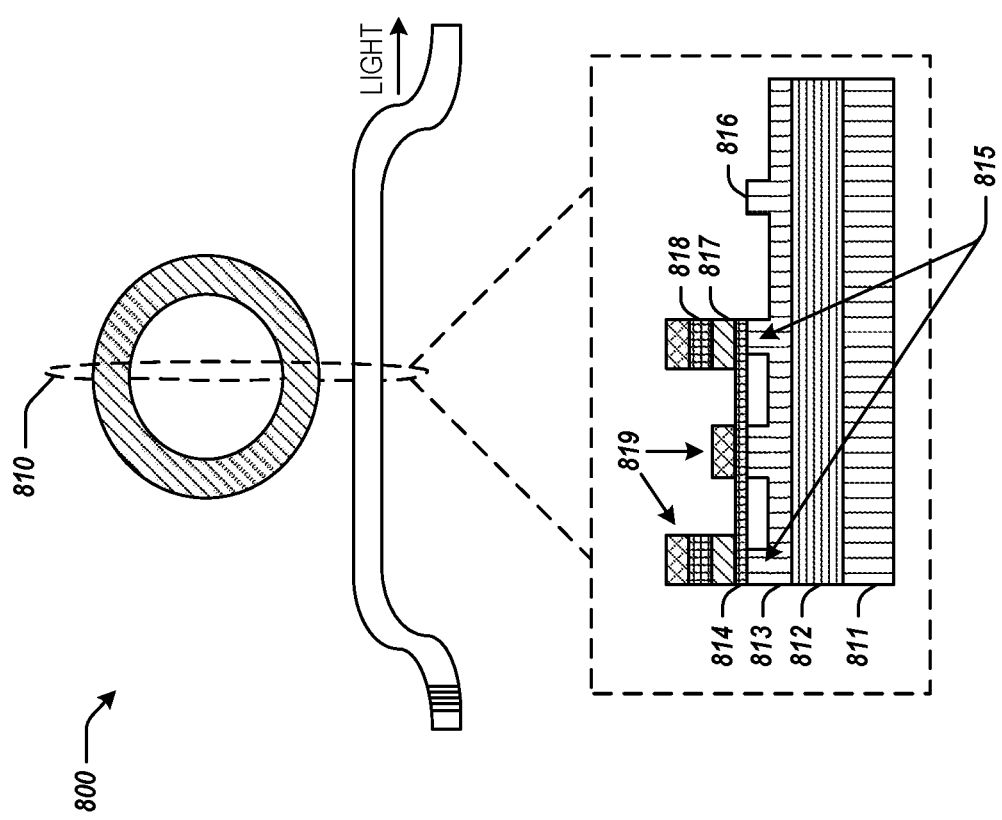
FIG. 8 is a block diagram depicting a cross-sectional view of an example multi-wavelength semiconductor laser.

FIG. 8 is a block diagram depicting a cross-sectional view 810 of an example multi-wavelength semiconductor laser 800. In some implementations, laser 800 may be similar to, or implemented by, laser 740 depicted in FIG. 7(d). The number and arrangement of these components is an example only and provided for purposes of illustration. Other arrangements and numbers of components may be utilized without departing from the examples of the present disclosure.

Cross-sectional view 810 may be a cross-sectional view of laser 800 at a location near the center of the waveguide ring 815 (e.g., waveguide 742 of FIG. 7(d)) where. In cross-sectional view 810, layers 811, 812, and 813 may make up a SOI substrate, wherein layer 811 is a bottom silicon layer, layer 812 is a buried oxide (BOX) layer (e.g., $SiO_2$), and layer 813 is an upper silicon layer. Waveguide ring 815 and waveguide 816 may be formed in upper silicon layer of the SOI substrate. A cladding layer 814 may be deposited on top of upper silicon layer 813. In some implementations, cladding layer 814 may comprise AlGaAs. In some implementations, cladding layer 814 may comprise GaAs.

Above cladding layer 814 may be QD layer 817 (e.g., QD layer 742) a second cladding layer 818 and metal layers 819. Cladding layer 818 may comprise materials similar to those described above with respect to cladding layer 814. Metal layers 819 may comprise any electrically conducting metal and may serve as electrodes for laser 800. The electrodes may be used to electrically inject electrical carriers that can be combined to generate light in QD layer 817.

FIGS. 9(a) and 9(b) are block diagrams depicting a top-down view and a side view, respectively, of an example multi-wavelength semiconductor laser 900. As show in FIGS. 9(a) and 9(b), laser 900 may include a waveguide 910 and a QD layer 920. In some implementations, laser 900 may be similar to, or implemented by, laser 100 of FIGS. 1(a)-1(c) and/or laser 200 of FIG. 2, with the addition of mirrors 930 and 940. The number and arrangement of these components is an example only and provided for purposes of illustration. Other arrangements and numbers of components may be utilized without departing from the examples of the present disclosure.

Mirrors 930 and 940 may be used for optical feedback to reflect light in waveguide 910. In the example illustrated in FIGS. 9(a) and 9(b), mirror 940 may be etched into waveguide 910 at one end of waveguide 910 (e.g., an end near the end of the light path through laser 900). Mirror 940 may be implemented as a distributed Bragg reflector, a loop mirror, a reflective multimode interference (MMI) coupler, a sidewall grating, etc. Mirror 930 may be implemented by etching QD layer 920 and/or waveguide 910, and depositing a metal layer to form a high reflectivity mirror. Mirror 930 and 940 may be designed such that they have low loss, broad reflection bandwidth, and cause a minimal amount of dispersion or compensate for dispersion introduced by the rest of the laser cavity.

In some implementations, mirror 930 may have greater reflectivity than mirror 940 to ensure that light primarily travels in one direction (e.g., left to right as illustrated in FIGS. 9(a) and 9(b)). Example reflectivity of mirror 930 may range from about 90% reflectivity or greater while example reflectivity of mirror 940 may range from about 10%-70% reflectivity. Mirror 940 with too low of reflectivity may not provide enough optical feedback to make laser 900 lase, while too high of reflectivity may result in a low output power.

The foregoing disclosure describes a number of example implementations of multi-wavelength semiconductor lasers. For purposes of explanation, certain examples are described with reference to the components illustrated in FIGS. 1(a)-1(c), 2, 3(a) and 3(b), 4(a)-4(e), 5, 6, 7(a)-7(d), 8, and 9(a) and 9(b). The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Thus, the present disclosure merely sets forth possible examples of implementations, and many variations and modifications may be made to the described examples. All such modifications and variations are intended to be included within the scope of this disclosure and protected by the following claims.

The invention claimed is:

1. A multi-wavelength semiconductor laser, comprising:
a silicon-on-insulator (SOI) substrate;
a quantum dot (QD) layer above the SOI substrate, the QD layer including an active region, and at least one end of the QD layer having an angled junction;
a waveguide included in an upper silicon layer of the SOI substrate, wherein the waveguide comprises multiple widths along the length of the waveguide; and
a mode converter included in the waveguide to facilitate optical coupling of a lasing mode to the waveguide by forming tapers between the multiple widths of the waveguide such that an area of space in the waveguide between the tapers defines a laser cavity.

2. The multi-wavelength semiconductor laser of claim 1, wherein the tapering formed by the mode converter pulls the lasing mode into a silicon of the waveguide.

3. The multi-wavelength semiconductor laser of claim 2, wherein:
the active gain region is above a portion of the waveguide; and
the tapers formed by the mode converter are under the QD layer.

4. The multi-wavelength semiconductor laser of claim 2, wherein the multiple lengths of the waveguide includes at least a first width and a second width, the first width being greater than or less than the second width, and the tapers formed by the mode converter tapers the waveguide between the first width and the second width such that the area of space in the waveguide between the first width and the second width defines the laser cavity.

5. The multi-wavelength semiconductor laser of claim 1, comprising:
a saturable absorber (SA) included in the QD layer to reduce amplitude noise and manipulate the temporal behavior of the laser.

6. The multi-wavelength semiconductor laser of claim 5, wherein the SA comprises a reverse biased or unbiased subregion of gain material of the active gain region.

7. The multi-wavelength semiconductor laser of claim 6, wherein the SA is electrically isolated from the remaining active gain region, the electrical isolation formed by at least one of implantation or etching of portions of the QD layer surrounding the SA.

8. A multi-wavelength semiconductor laser, comprising:
a waveguide included in a first silicon layer of a silicon-on-insulator (SOI) substrate, wherein the waveguide comprises multiple widths along the length of the waveguide;
a quantum dot (QD) layer above the SOI substrate, the QD layer including an active gain region, and at least one end of the QD layer having a tapered junction;
a mode converter comprising tapers in the waveguide between the multiple widths to couple a lasing mode to the waveguide by defining a laser cavity in an area of space in the waveguide between the tapers; and
a first mirror and a second mirror.

9. The multi-wavelength semiconductor laser of claim 8, wherein the first mirror and the second mirror are included in the waveguide.

10. The multi-wavelength semiconductor laser of claim 9, comprising:
at least one saturable absorber (SA) in the active gain region to reduce amplitude noise and manipulate the temporal behavior of the laser.

11. The multi-wavelength semiconductor laser of claim 10, wherein the at least one SA comprises:
a first SA near a first end of the QD layer; and
a second SA near a second end of the QD layer opposite the first end.

12. The multi-wavelength semiconductor laser of claim 9, comprising:
a saturable absorber (SA) included in the active gain region; and
a booster semiconductor optical amplifier (SOA), the SA and booster SOA to reduce amplitude noise of the laser.

13. The multi-wavelength semiconductor laser of claim 11, wherein the booster SOA comprises:
a waveguide;
a mode converter included in the waveguide; and
a QD layer, including:
an active gain region; and
tapered or angled junctions at each end of the QD layer.

14. The multi-wavelength semiconductor laser of claim 8, wherein the first mirror and the second mirror are included in the QD layer.

15. The multi-wavelength semiconductor laser of claim 14, wherein the first mirror and the second mirror are formed by etching a top portion of the QD layer.

16. The multi-wavelength semiconductor laser of claim 14, wherein the first mirror and the second mirror are formed by etching a bottom portion of the QD layer before bonding the QD layer to the SOI substrate.

17. The multi-wavelength semiconductor laser of claim 14, wherein the first mirror and the second mirror are formed by etching the QD layer and a top portion of the waveguide.

* * * * *